United States Patent [19]

Childs et al.

[11] Patent Number: 5,124,762
[45] Date of Patent: Jun. 23, 1992

[54] GAAS HETEROSTRUCTURE METAL-INSULATOR-SEMICONDUCTOR INTEGRATED CIRCUIT TECHNOLOGY

[75] Inventors: Timothy T. Childs, Minnetonka; Thomas Nohava, Apple Valley, both of Minn.

[73] Assignee: Honeywell Inc., Minneapolis, Minn.

[21] Appl. No.: 636,321

[22] Filed: Dec. 31, 1990

[51] Int. Cl.$^5$ .................. H01L 29/16; H01L 29/205; H01L 29/80; H01L 29/20
[52] U.S. Cl. ........................ 357/16; 357/22; 357/23.2
[58] Field of Search ............. 357/16, 23.2, 22, 91, 357/56

[56] References Cited

U.S. PATENT DOCUMENTS

| | | | |
|---|---|---|---|
| 4,806,998 | 2/1989 | Vinter et al. | 357/22 |
| 4,807,001 | 2/1989 | Hida | 357/22 |
| 5,036,374 | 7/1991 | Shimbo | 357/23.2 |

OTHER PUBLICATIONS

Akinwande et al.: "A 500-MHz 16X16 Complex Multiplier Using Self-Alligned GaAs Heterostructure FET Technology" dated *Oct. 1989* published in *IEE Journal of Solid State Circuits*, vol. 24, No. 5.

*Primary Examiner*—Mark Prenty
*Assistant Examiner*—D. Morin
*Attorney, Agent, or Firm*—John G. Shudy, Jr.

[57] ABSTRACT

Heterostructure metal insulator semiconductor integrated circuit technology resulting in, for instance, GaAs field-effect-transistors having much less gate current leakage and greater voltage range than like technology of the related art.

12 Claims, 4 Drawing Sheets

EPI-LAYER MIS GATE ON MODFET

BAND DIAGRAM OF MIS-MODFET
(ELIMINATES GATE CURRENT)

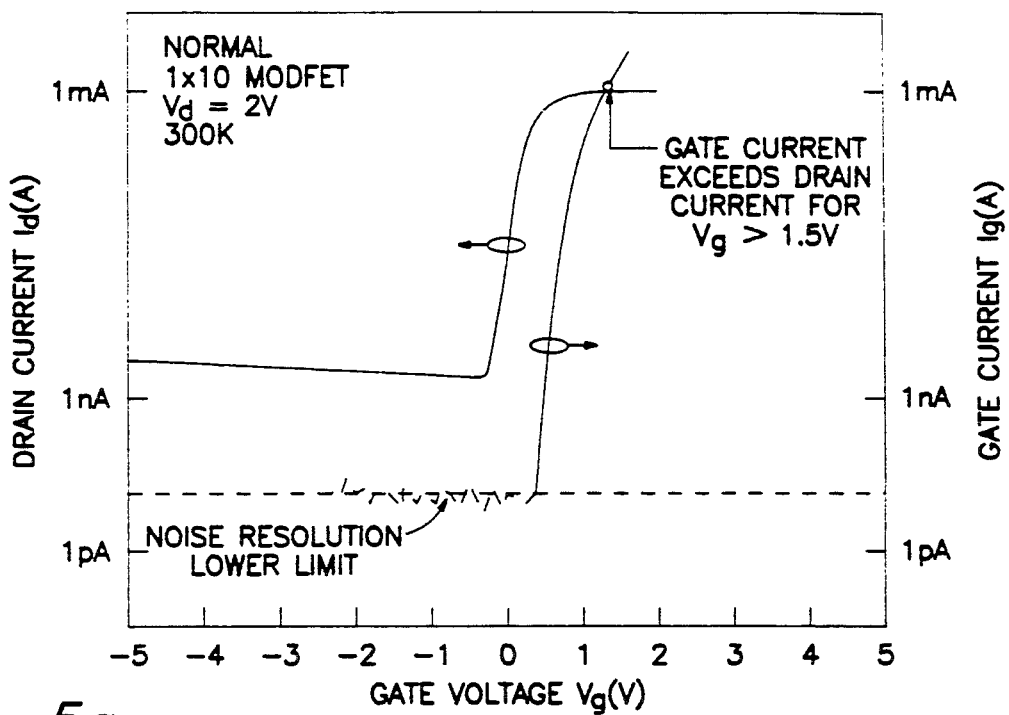
Fig. 5a  NORMAL 1x10 MODFET AT $V_g$=1.4 VOLTS $I_g > I_{ds}$
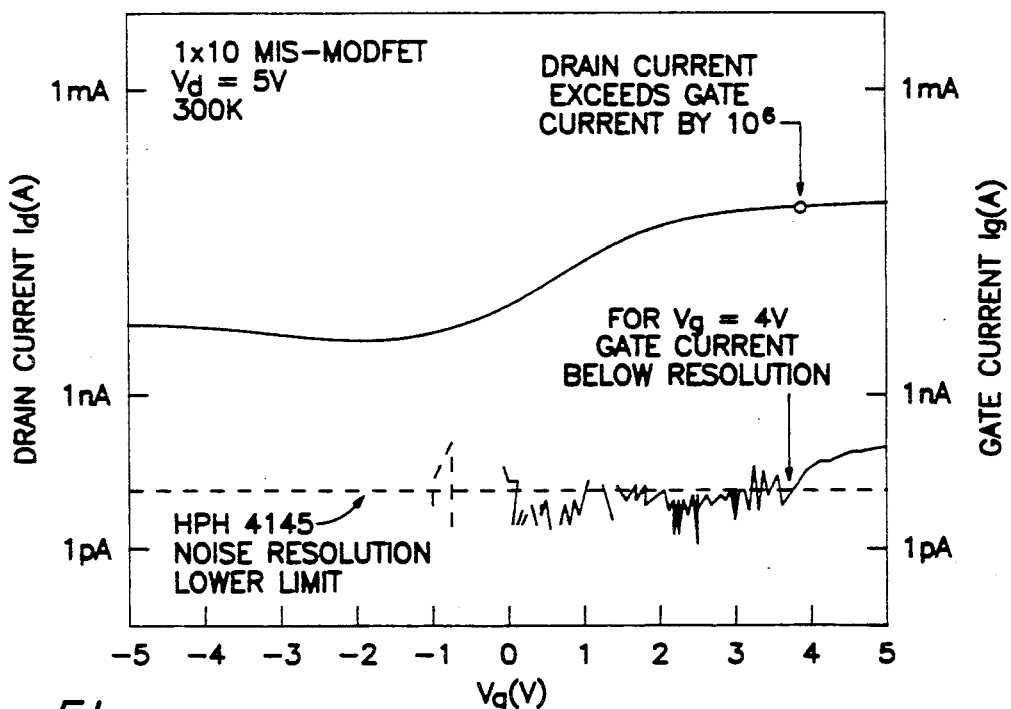
Fig. 5b  1x10 MIS-MODFET AT $V_g$=4.0 VOLTS
$I_g$ SIX ORDERS OF MAGNITUDE ($10^6$) LOWER THAN $I_{ds}$

GAAS HETEROSTRUCTURE METAL-INSULATOR-SEMICONDUCTOR INTEGRATED CIRCUIT TECHNOLOGY

FIELD OF THE INVENTION

The invention pertains to integrated circuit technology and particularly to heterostructure metal-insulator-semiconductor devices.

BACKGROUND OF THE INVENTION

The related art consists of gallium arsenide (GaAs) doped channel heterostructure field effect transistor (DCHFET), complementary heterostructure field effect transistor (C-HIGFET) (with a high aluminum arsenide (AlAs) mole fraction) and metal oxide semiconductor field effect transistor (MOSFET) (without a molecular beam epitaxy (MBE) grown insulator) technologies. These technologies have the limitations of excessive gate leakage, low voltage swing, limited dynamic range and notable power consumption. The present invention results in significant improvements in these parameters.

SUMMARY OF THE INVENTION

The invention is a new method and structure for attaining FET technology which provides lower gate leakage and greater voltage swings resulting in lower power consumption for digital applications and wider dynamic range for analog and microwave applications. Fabrication of the present invention is simple and compatible with that of GaAs integrated circuit and monolithic microwave integrated circuit (MMIC) technologies.

BRIEF DESCRIPTION OF THE DRAWINGS

FIG. 5a is a performance graph of a related art MODFET.

FIG. 5b is a performance graph of a MODFET incorporating the present invention.

DESCRIPTION OF THE PREFERRED EMBODIMENT

Figure 1:
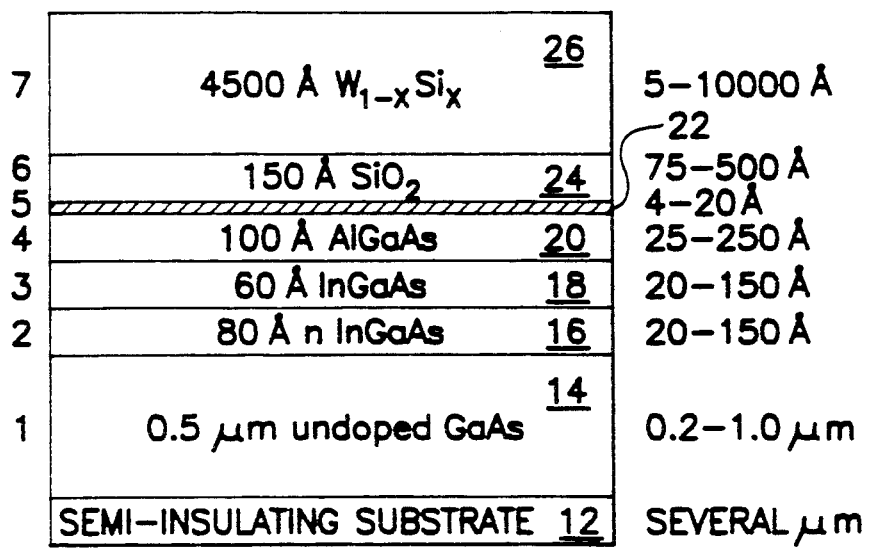
FIG. 1 reveals the basic structure of a GaAs heterostructure (H) metal-insulator-semiconductor (MIS) technology.
Figure 2:
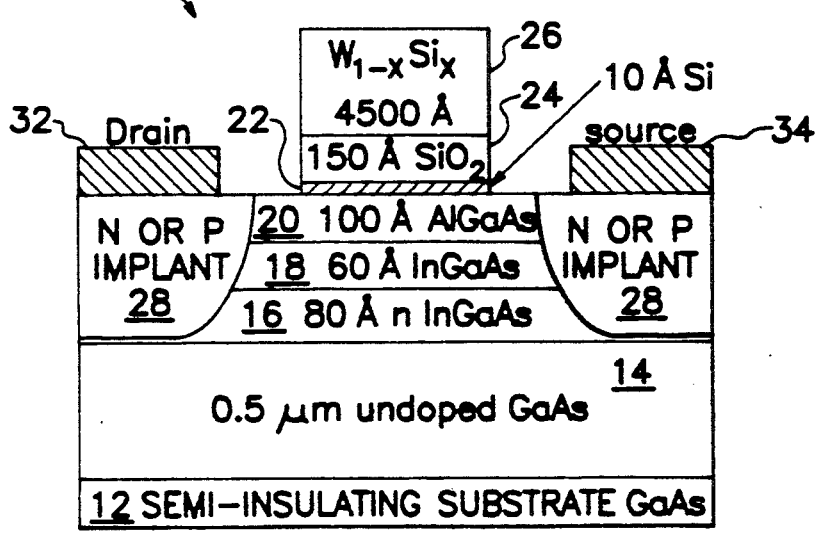
FIG. 2 shows an H-MIS field-effect transistor (FET).

FIG. 1 shows the sequence of layers 10 for H-MIS technology as applied for manufacturing a FET. On a semi-insulating GaAs wafer or substrate in a GaAs growth chamber (utilizing MBE or MOCVD), a 0.5 micron buffer layer 14 of undoped GaAs is grown on substrate 12. Layer 14 may be at another thickness between 0.2 and 1.0 micron. Layer 12 typically is several microns thick. 80 angstroms of an n doped InGaAs layer 16 is grown on layer 14. Layer 16 may be at another thickness between 20 and 150 angstroms. 60 angstroms of an undoped InGaAs layer 18 is grown on layer 16. Layer 18 may be at another thickness between 20 and 150 angstroms. A 100 angstrom layer 20 of undoped AlGaAs is grown on layer 18. Layer 20 may be at another thickness between 25 and 250 angstroms. An interface of 2d electron gas results between layers 18 and 20 for fast mobility, as in the case of a MODFET. Then with wafer temperature structure 11 at about 300 degrees Celsius, insulator layer 22 is made by growing about 10 angstroms of silicon on layer 20, followed by the growth of about 150 angstroms of lower stress $SiO_2$ as insulator layer 24 on layer 22. Layer 22 may be at another thickness between 4 and 20 angstroms, and layer 24 may be at another thickness between 75 and 500 angstroms. $SiO_2$ layer 24 can alternatively be deposited ex-situ with a plasma enhanced chemical vapor deposition (PECVD) ratio of $He/N_2O/SiH_4$ flow rate of 4050/200/32 units in helium. The substrate temperature during Si layer 22 and $SiO_2$ layer 24 growth, the thicknesses of Si layer 22 and $SiO_2$ layer 24, and the low stress growth or deposition of $SiO_2$ layer 24 are critical stages of the MIS-making process. Ultra thin layer 22 of Si epitaxially grown on AlGaAs layer 20 prevents the oxidation of GaAs while also providing a base for $SiO_2$ insulator 24. The low defect Si/AlGaAs and Si/$SiO_2$ interfaces between layers 22 and 20, and layers 22 and 24, respectively, reduce traps while allowing Si-$SiO_2$ insulator 22 and 24 to virtually eliminate gate leakage of device 30. However, the thin layer 22 of Si turns into $SiO_2$ when exposed or covered with $SiO_2$.

On top of insulator layer 24, 4500 angstroms of $W_{1-x}Si_x$, other metal silicide, as appropriate, as layer 26 is deposited for a gate. Layer 26 may be another thickness between 5 and 10,000 angstroms. Interconnect metal may then be attached to layer 26. All of the thicknesses of structure 10 may be adjusted for optimization of device 30.

Layer 26 is covered by a mask to define the gate structure. Device 30 is made by etching layer 26 of $W_{1-x}Si_x$ with $CF_4/O_2$ reactive ion etching (RIE). Layers 24 and 22 of $SiO_2$ and Si are etched in a $C_2F_6/CHF_3$ plasma. A standard self-aligned gate GaAs H-FET integrated circuit (IC) process (N, P or complementary) is performed (incorporate IEEE article). Specifically, an N or P implant is performed on layers 16, 18 and 20 N channel, resulting in an N channel or P channel FET, respectively. The N implant is a silicon ions and the P implant is of beryllium ions.

A lattice matched MIS surface, with the adhesiveness of dimmer arsenic, low stress $SiO_2$ and Si-based gate metal, established a robust surface that can withstand the rapid optical anneal (ROA) steps on IC processing. N or P, as appropriate, ohmic contacts 32 and 34 are formed with Au:Ge based metallization. Metallization for two levels of interconnects for circuits are defined by lift-off.

Figure 3:
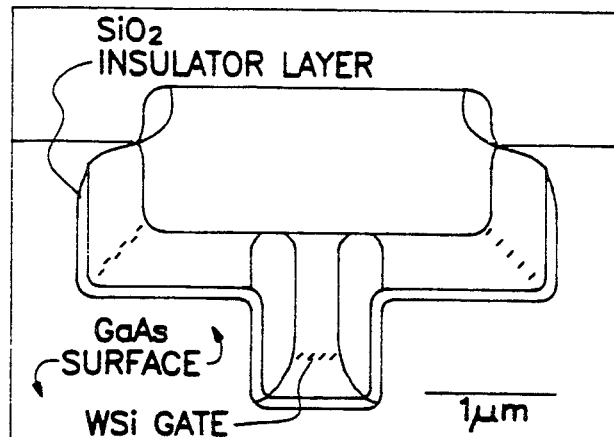
FIG. 3 is a line drawing of an insulated gate of an H-MIS modulation-doped (MOD) FET.
Figure 4:
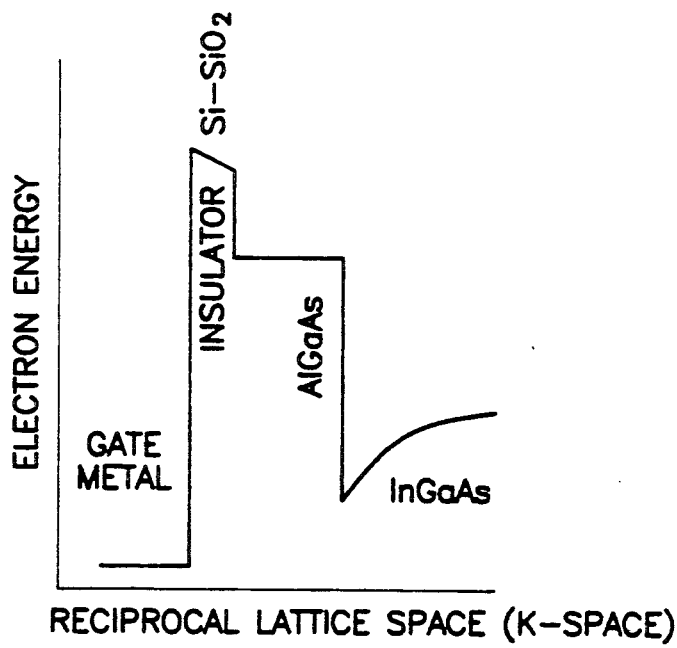
FIG. 4 is a band diagram of a MIS-MODFET.

FIG. 3 shows a line drawing of a magnified picture of an Epi-layer (epitaxy layer) MIS gate for a MODFET. FIG. 4 is an energy band diagram of the MIS-MODFET, showing electron energy versus reciprocal lattice space (K-space). The diagram illustrates the basis for the elimination of gate current with the insulator layer.

Figure 6:
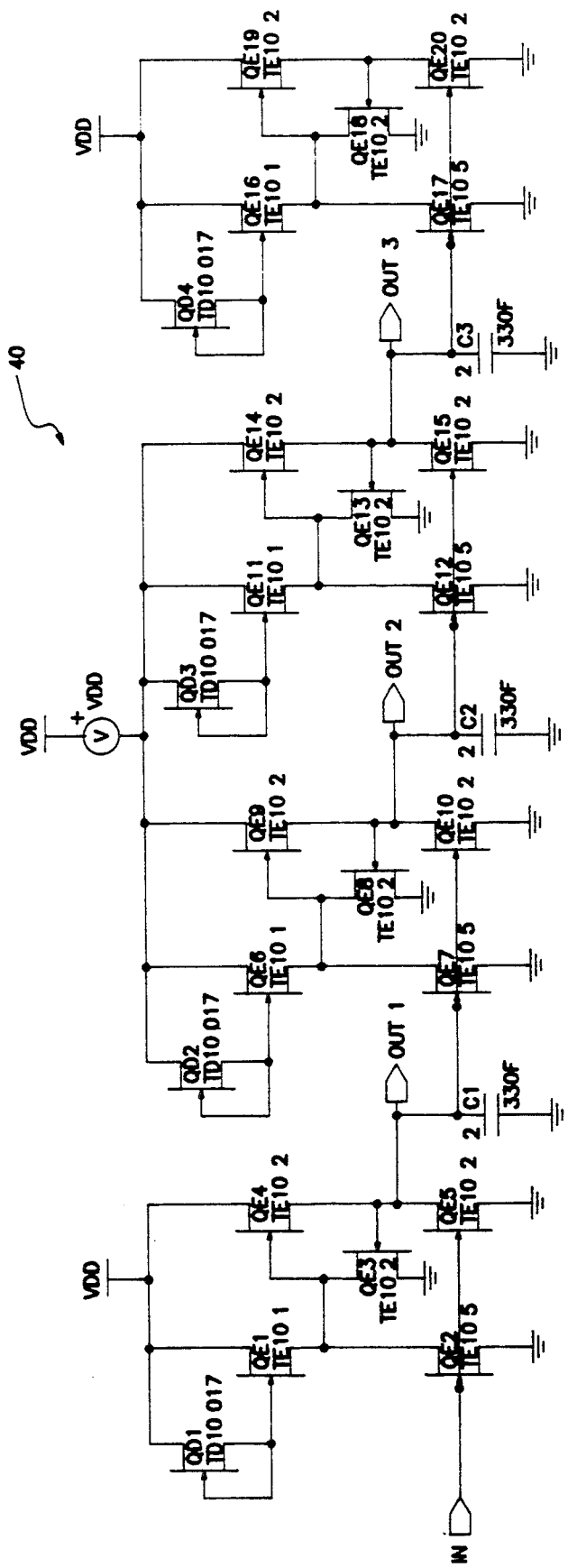
FIG. 6 is a schematic of a ring oscillator incorporating the present invention.

FIG. 5 is a performance graph of a normal related-art 1×10 micron MODFET Note that as the gate voltage approaches +1 volt the gate current greatly increases and the drain current reaches a maximum level. The gate current exceeds the drain current at gate voltages greater than +1.5 volts. FIG. 6 is a performance graph, similar to FIG. 5, for the present invention incorporated in a 1×10 micron MIS MODFET. In contrast, the drain current exceeds the gate current by $10^6$ times at a gate voltage greater than 4 volts. The gate leakage is less than 10 picoamperes at a gate voltage of greater than 3 volts. The gate voltage tolerance with the present invention is from −15 to +15 volts. These performance specifications greatly exceed those of comparable related-art GaAs technologies.

The invention was incorporated into an enhanced-/enhanced (E/E) logic FET feedback logic (FFL) 11-stage ring oscillator 40 shown in FIG. 6, having a fanout=1, fanin=1 and 1 millimeter of metal at each of the 11 stages. Testing showed the interconnect metal serpentines produced a capacitance of 0.33 picofarads at each stage for a total of 3.63 picofarads. At room temperature, the oscillator circuit yielded 31.0 MHz (i.e., 1.4 nanoseconds per gate) with a total current of 0.28 milliamperes. This translates to a power dissipation of 75 microwatts per gate. At a temperature of 170 degrees Celsius, the circuit yields 90 MHz (i.e., 520 picoseconds per gate. At 70 degrees Celsius, the power dissipation was less than 50 microwatts per gate. The circuit built and utilized was not designed for achieving a particular optimized speed or power dissipation but to demonstrate the feasibility of a functional large scale integrated (LSI) MISFET.

We claim:

1. A heterostructure metal insulator semiconductor comprising:
    a semi-insulating substrate;
    a layer of undoped gallium arsenide on said semi-insulting substrate;
    a layer of n doped indium gallium arsenide on said undoped gallium arsenide;
    a layer of undoped indium gallium arsenide on said n doped indium gallium arsenide;
    a layer of undoped aluminum gallium arsenide on said undoped indium gallium arsenide;
    a thin layer of silicon on part of said layer of undoped aluminum gallium arsenide;
    a layer of silicon dioxide on said silicon;
    a layer of tungsten silicide on said silicon dioxide;
    a first portion of said layers of aluminum gallium arsenide, undoped indium gallium arsenide and n doped indium gallium arsenide, having a first ion implant; and
    a first ohmic contact on said first implant.

2. Semiconductor of claim 1 further comprising:
    a second portion of said layers of aluminum gallium arsenide, undoped indium gallium arsenide, and n doped indium gallium arsenide, having a second ion implant; and
    a second ohmic contact on said second implant.

3. Semiconductor of claim 1 further comprising an interface of electron gas between said layer of undoped indium gallium arsenide and said layer of undoped aluminum gallium arsenide.

4. A semiconductor comprising:
    a substrate;
    a layer of undoped GaAs on said substrate;
    a layer of n doped InGaAs on said layer of undoped GaAs;
    a layer of undoped InGaAs on said n doped InGaAs;
    a layer of undoped AlGaAs on said layer of undoped InGaAs;
    a layer of Si on a portion of said layer of undoped AlGaAs;
    a layer of $SiO_2$ on said layer of Si; and
    a layer of metal silicide on said layer of $SiO_2$.

5. Semiconductor of claim 4, further comprising at least one ion implant in said layers of undoped AlGaAs, undoped InGaAs and n doped InGaAs.

6. Semiconductor of claim 5 wherein said layers of metal silicide, $SiO_2$ and Si form a mesa on said layer of undoped AlGaAs.

7. Semiconductor of claim 6 wherein:
    said layer of metal silicide has a thickness between 5 and 10,000 angstroms;
    said layer of $SiO_2$ has a thickness between 75 and 500 angstroms;
    said layer of Si has a thickness between 4 and 20 angstroms;
    said layer of undoped AlGaAs has a thickness between 25 and 250 angstroms;
    said layer of undoped InGaAs has a thickness between 20 and 150 angstroms;
    said layer of n doped InGaAs has a thickness between 20 and 150 angstroms; and
    said layer of undoped GaAs has a thickness between 0.2 and 1.0 micron.

8. Semiconductor of claim 7 wherein:
    the metal of said layer of metal silicide is tungsten; and
    said substrate is of semi-insulating GaAs.

9. Semiconductor of claim 8 further comprising an ohmic contact on said layer of undoped AlGaAs in an area of said at least one ion implant.

10. A semiconductor comprising:
    a semi-insulating substrate;
    a layer of undoped gallium arsenide on said semi-insulating substrate;
    a layer of n doped indium gallium arsenide on said undoped gallium arsenide;
    a layer of undoped indium gallium arsenide on said n doped indium gallium arsenide;
    a layer of undoped aluminum gallium arsenide on said undoped indium gallium arsenide;
    a layer of silicon dioxide on a portion of said layer of undoped aluminum gallium arsenide;
    a layer of tungsten silicide on said silicon dioxide;
    a first portion of said layers of undoped aluminum gallium arsenide, undoped indium gallium arsenide and n doped indium gallium arsenide, having a first ion implant.

11. Semiconductor of claim 10 further comprising:
    a second portion of said layers of undoped aluminum gallium arsenide, undoped indium gallium arsenide, and n doped indium gallium arsenide, having a second ion implant;
    a first ohmic contact on said first ion implant; and
    a second ohmic contact on said second ion implant.

12. Semiconductor of claim 10 further comprising an interface of electron gas between said layer of undoped indium gallium arsenide and said layer of undoped aluminum gallium arsenide.

* * * * *

UNITED STATES PATENT AND TRADEMARK OFFICE
CERTIFICATE OF CORRECTION

PATENT NO. : 5,124,762

DATED : June 23, 1992

INVENTOR(S) : TIMOTHY T. CHILDS, THOMAS NOHAVA

It is certified that error appears in the above-identified patent and that said Letters Patent is hereby corrected as shown below:

Column 3, line 53, delete "electron" and insert --election--

Signed and Sealed this

Twenty-fourth Day of August, 1993

Attest:

BRUCE LEHMAN

Attesting Officer

Commissioner of Patents and Trademarks